United States Patent [19]

Nakamura et al.

[11] Patent Number: 4,855,591

[45] Date of Patent: Aug. 8, 1989

[54] ELECTRO-OPTICAL VOLTAGE DETECTOR

[75] Inventors: Takuya Nakamura; Shinichiro Aoshima; Yutaka Tsuchiya, all of Shizuoka, Japan

[73] Assignee: Hamamatsu Photonics Kabushiki Kaisha, Shizuoka, Japan

[21] Appl. No.: 203,929

[22] Filed: Jun. 8, 1988

[30] Foreign Application Priority Data

Jun. 10, 1987 [JP] Japan .................. 62-144984

[51] Int. Cl.$^4$ ............................. G01R 19/00
[52] U.S. Cl. ...................... 250/225; 324/96; 350/385; 356/368
[58] Field of Search ............ 250/225, 231 R; 324/77 K, 96; 350/384, 385, 393, 390; 356/368

[56] References Cited

U.S. PATENT DOCUMENTS

| | | | |
|---|---|---|---|
| 4,269,483 | 5/1981 | Feldtkeller | 324/96 |
| 4,446,425 | 5/1984 | Valdmanis et al. | 324/77 K |
| 4,603,293 | 7/1986 | Mourou et al. | 324/96 |
| 4,618,819 | 10/1986 | Mourou et al. | 324/77 K |

FOREIGN PATENT DOCUMENTS 0197196 10/1986 European Pat. Off. .

OTHER PUBLICATIONS

Valdmanis, J. A. et al., "Subpicosecond Electrooptic Sampling: Principles and Applications", IEEE Journal of Quantum Electronics, vol. qe-22, No. 1, pp. 69–78, Jan. 1986.

Valdmanis, J. A. et al., "Picosecond Electrooptic Sampling System", Appl. Phys. Lett., vol. 41, No. 3, pp. 211–212, Aug. 1982.

Valdmanis, J. A. et al., "Subpicosecond Electrical Sampling", IEEE Journal of Quantum Electronics, vol. qe-19, No. 4, pp. 664–667, Apr. 1983.

Kolner, B. H. et al., "Electro-Optic Sampling With Picosecond Resolution", Electronics Letters, vol. 19, No. 15, pp. 574–575, Jul. 1983.

Tsuchiya, Y., "Advances in Streak Camera Instrumentation for the Study of Biological and Physical Processes", IEEE Journal of Quantum Electronics, vol. qe-20, No. 12, pp. 1516–1528, Dec. 1984.

Valdmanis, J. A., "High-Speed Optical Electronics: The Picosecond Optical Oscilloscope", Solid State Technology/Test and Measurement World, pp. S40–S44, Nov. 1986.

Valdmanis, J. A. et al., "Electro-Optic Sampling: Testing Picosecond Electronics Part 1. Principles and Embodiments", Laser Focus/Electro-Optics, pp. 84–96, Feb. 1986.

Valdmanis, J. A. et al., "Electro-Optic Sampling: Testing Picosecond Electronics Part 2. Applications", Laser Focus/Electro-Optics, pp. 96–106, Mar. 1986.

Valdmanis, J. A. et al., "Subpicosecond Electrical Sampling and Applications", Picosecond Optoelectronic Devices, pp. 249–270, 1984.

Williamson, S. et al., "Picosecond Electro-Electron Optic Oscilloscope", Proc. Conf. Picosecond Electron. Optoelectron., pp. 58–61, (N.Y. Springer-Verlag), 1985.

Kolner, B. H. et al., "Electrooptic Sampling in GaAs Intergrated Circuits", IEEE Journal of Quantum Electronics, vol. qe-22, pp. 79–93, Jan. 1987.

Nees, J. et al., "Noncontact Electro-Optic Sampling With a GaAs Injection Laser", Electronics Letters, vol. 22, No. 17, pp. 918–919, Aug. 1986.

Primary Examiner—Edward P. Westin
Attorney, Agent, or Firm—Finnegan, Henderson, Farabow, Garrett, & Dunner

[57] ABSTRACT

A voltage detector detects a voltage developing in a selected area of an object such as an integrated circuit by utilizing an electro-optic material equipped in an optical probe. A change in refractive index of the electro-optic material which is caused by the voltage in the object, is detected as a change of polarization of a light beam passing through the electro-optic material. In order to stably trigger a streak camera, the first reference light split before entering the electro-optic material and the second reference light split after emerging from the electro-optic material are used in the form of the difference in intensity between the two reference light beams for generating a trigger signal supplied to the streak camera.

8 Claims, 2 Drawing Sheets

ELECTRO-OPTICAL VOLTAGE DETECTOR

BACKGROUND OF THE INVENTION

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong demand exists in the art for detecting such rapidly changing voltage with high precision without affecting the condition of the fine-line portions. However, this need has not been fully met by the prior art voltage detectors. With devices of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by the electron beam.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese Patent Application No. 137317/1987 filed on May 30, 1987) that voltage be detected by making use of the polarization of a light beam that changes with the voltage developing in a selected area of an object to be measured.

A voltage detector operating on this principle is schematically shown in FIG. 3. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 through a condenser lens 60; an optical fiber 92 for guiding reference light from the optical probe 52 into a photoelectric converter 55 through a collimator 90; an optical fiber 93 for guiding output light from the optical probe 52 into a photoelectric converter 58 through a collimator 91; and a comparator circuit 61 for comparing the electric signals from the photoelectric converters 55 and 58.

The optical probe 52 is equipped with an electro-optic material 62 such as an optically uniaxial crystal of lithium tantalate ($LiTaO_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 3 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The light beam is polarized by the polarizer 54 and a predetermined polarized light having intensity I is launched into the electro-optic material 62 in the optical probe 52 through the beam splitter 56. Each of the reference light and the input light, which are produced by passage through the beam splitter 56, has an intensity of $I/2$. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as $l$, the state of polarization of input light launched into that material will change in proportion to the difference between refractive indices for the ordinary ray and the extraordinary ray and to the length $2l$ as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to $(I/4) \sin^2[(\pi/2)V/V_0]$ in the analyzer 57 before it is further fed into the photoelectric converter 58. In the formula expressing the intensity of output light emerging from the analyzer 57, V is the voltage developing in the object to be measured, and $V_0$ is a half-wave voltage.

In the comparator circuit 61, the intensity of reference light produced from the photoelectric converter 55, or I/2, is compared with the intensity of output light produced from the other photoelectric converter 58, or $(I/4) \sin^2[(\pi/2)V/V_0]$.

The intensity of output light, or $(I/4) \sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 3, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions. If desired, a pulse light source such as a laser diode that produces light pulses of a very short pulse width may be used as a light source to ensure that rapid changes in the voltage on the object to be measured are sampled at extremely short time intervals. Rapid changes in the voltage on the object of interest can be measured with a very high time resolution by using a CW light source and a quick-response detector such as a streak camera. Either method is capable of precision detection of rapid changes in voltage.

By the way, if a CW (Continuous-Wave) light source such as a CW laser is used as the light source 53, with a streak camera used as a photodetector, a trigger signal to be supplied to the deflection electrode drive circuit in the streak camera cannot be produced from the CW laser and the voltage developing in a selected area of an object being measured cannot be detected by the streak camera in synchronism with the trigger signal.

SUMMARY OF THE INVENTION

An object, therefore, of the present invention is to provide a voltage detector that enables a streak camera to be used as a photodetector in combination with a CW laser as a CW light source, with a stable electric trigger signal being supplied to the streak camera during detection of the voltage developing in a selected area of an object being measured.

A voltage detector according to the invention comprises: a light source for emitting a light beam; a splitting and extracting means for splitting the light beam issuing from the light source into a first reference beam with a predetermined polarized component and an input beam to be launched into an electro-optic material with a polarized component perpendicular to that of the first reference beam, and for splitting an output beam emerging from the electro-optic material into a second reference beam with a predetermined polarized component and a signal beam with a polarized component perpendicular to that of the second reference beam; a trigger producing means that produces an electric trigger signal on the basis of the difference in intensity between the first reference beam and the second reference beam; and a quick-response detector that measures the signal beam from said splitting and extracting means by sweeping it in synchronism with said electric trigger signal.

Other and further objects, features and advantages of the invention will appear more fully from the following description taken in connection with the accompanying drawings.

DETAILED DESCRIPTION OF THE PREFERRED EMBODIMENTS

Figure 1:
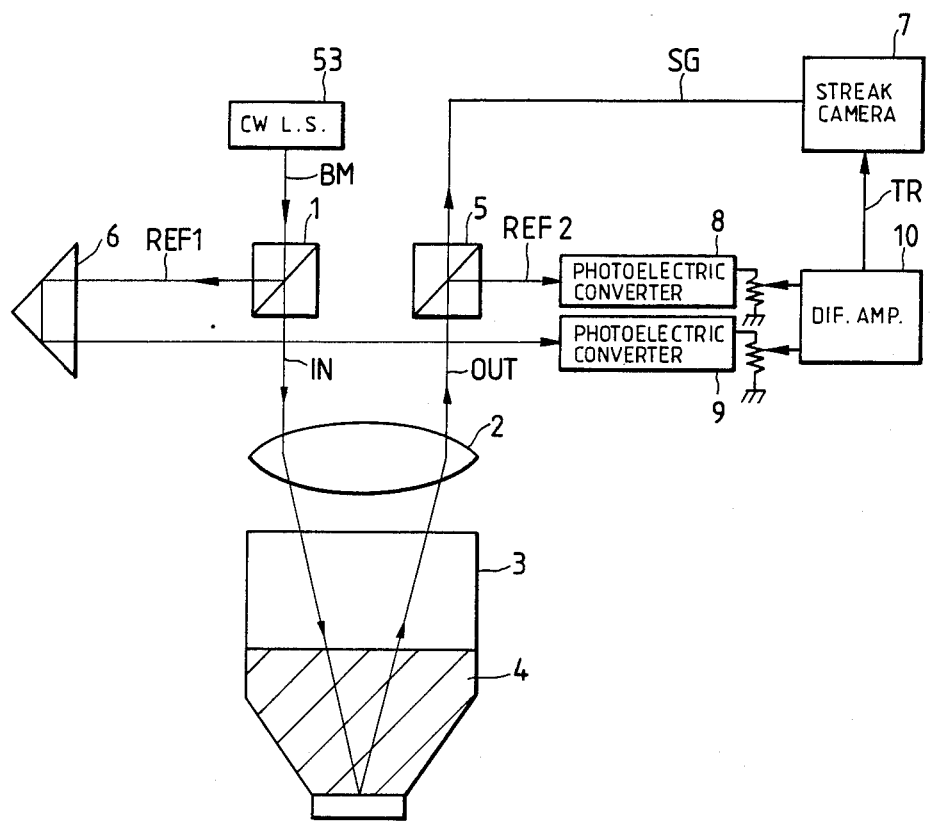
FIG. 1 is a schematic diagram showing the composition of a voltage detector according to an embodiment of the present invention.
Figure 2:
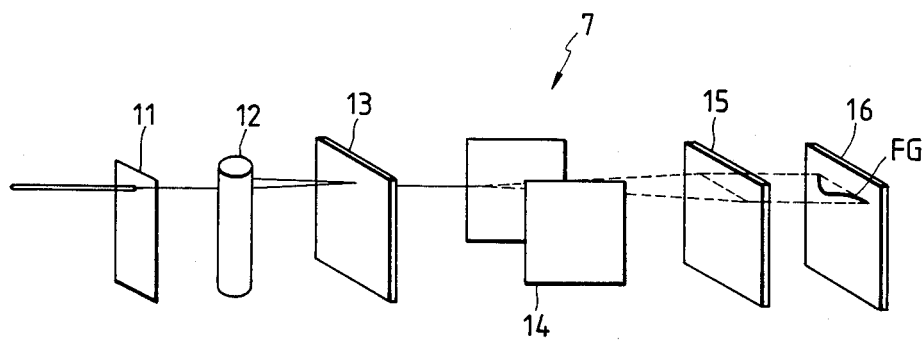
FIG. 2 is a schematic diagram showing the composition of a streak camera.
Figure 3:
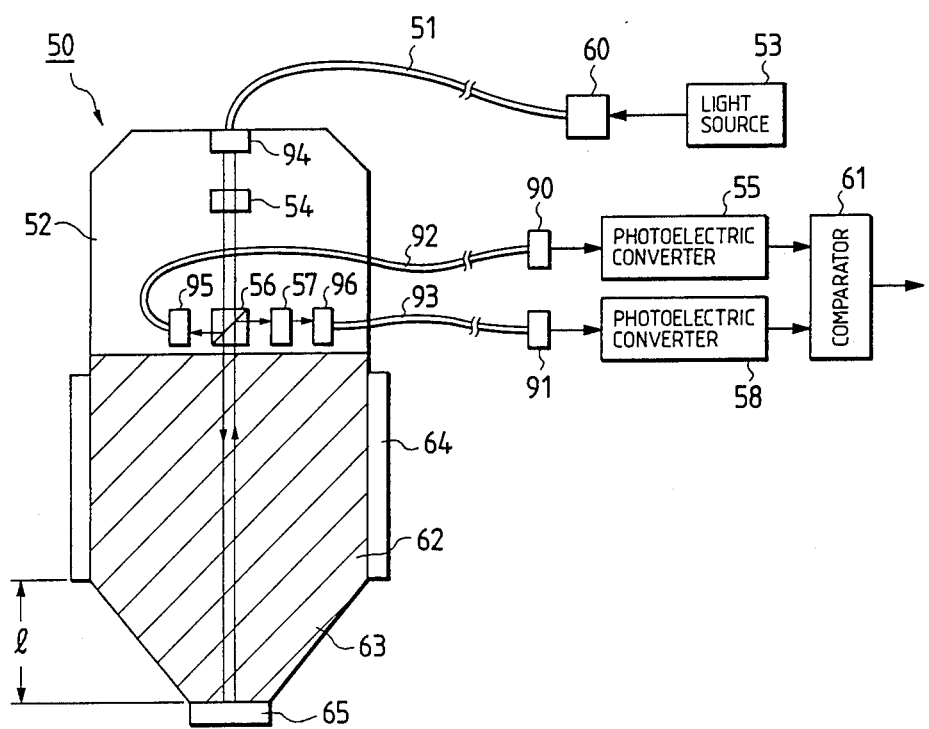
FIG. 3 is a schematic diagram showing the composition of a voltage detector having been proposed in Japanese Patent Application No. 137317/1987.

FIG. 1 is a schematic diagram showing the composition of a voltage detector according to an embodiment of the present invention. FIG. 2 is a schematic diagram showing the composition of a streak camera.

The voltage detector shown in FIG. 1 comprises the following components: a CW light source 53 in the form of a CW laser; a polarizing beam splitter 1 that splits a light beam BM from the light source 53 into two light beams, one having a predetermined polarized component and being extracted as an input beam IN to be directed toward a lens 2 and the other having a polarized component perpendicular to that of the input beam IN and being directed as the first reference beam REF1 toward a delay means 6; the lens 2 through which the input beam IN produced by splitting with the splitter 1 is launched into an electro-optic material 4 in an optical probe 3 and which allows an output beam OUT reflected from the tip of the electro-optic material 4 to emerge therefrom and thence travel on a different path from the input beam; and a polarizing beam splitter 5 that splits the output beam OUT from the lens 2 into two light beams and selectively extracts one light beam that has a predetermined polarized component and is launched as a signal beam SG into a streak camera.

The other component of light beam which is polarized at right angle with respect to the signal light SG is fed as the second reference beam REF2 into a photoelectric converter 8. The second reference beam REF2 is converted photoelectrically in the converter 8 and thence applied to a differential amplifier 10. The first reference beam REF1 is delayed for a predetermined time in the delay means 6 and thence supplied to a photoelectric converter 9, where it is converted to an electric signal for application to the differential amplifier 10.

In the differential amplifier 10, the electric signal from the photoelectric converter 8 is compared with the electric signal from the photoelectric converter 9 and the difference is supplied as an electric trigger signal TR to the streak camera 7.

As shown schematically in FIG. 2, the streak camera 1 is composed of the following components: a slit 11 onto which the signal beam SG from the polarizing beam splitter 5 is projected; a lens 12 into which the signal beam SG is launched through the slit 11; a photocathode 13 onto which the signal beam SG focused by the lens 12 is projected; deflection electrodes 14 that deflect transversely the electron beam produced from the photocathode 13 by photoelectric conversion; a microchannel plate 15 that increases the intensity of the deflected electron beam; and a phosphor screen 16 on which the electron beam from the microchannel plate 15 impinges. In FIG. 2, the microchannel plate 15 is shown to be separate from the phosphor screen 16, but in actual applications they are usually connected together. The lens 12 is shown to be cylindrical in FIG. 2, but this is not the usual case in practical applications. If, in this streak camera 7, a sawtooth voltage synchronous with the electric trigger signal TR is applied to the deflection electrodes 14, the signal beam SG encountering the photocathode 13 sequentially on a time basis can be swept transversely on the phosphor screen 16. By so doing, the change in the voltage developing in a selected area of the object being measured can be detected as a one-dimensional profile of light intensity FG on the phosphor screen 16, with the time axis being taken in the transverse direction, or sweep direction.

In the voltage detector having the composition described above, the light beam BM issuing from the CW light source 53 passes through the polarizing beam splitter 1, which splits the BM into the input beam IN with a predetermined polarized component traveling toward the lens 2 and the first reference beam REF1 heading for the delay means 6 with a polarized component perpendicular to that of IN.

The lens 2 allows the input beam IN having the predetermined polarized component to be launched into the electro-optic material 4 in the optical probe 3. When the voltage developing in the object being measured is not exerted upon the electro-optic material 4, the latter experiences no change in its refractive index, so the input beam IN launched into this material makes a round trip without experiencing any change in the state of its polarization and emerges as the output beam OUT from the material 4, followed by passage through the lens 2 and launching into the polarizing beam splitter 5. If, in the case where the first reference beam REF1 is equal in light intensity to the input beam IN to be launched into the electro-optic material 4, the polarizing beam splitter 5 is so designed as to produce the second reference beam REF2 by reflecting the same polarized component as IN, all the output beam emerging from the electro-optic material 4 is reflected by the beam splitter 5 to be used as the second reference beam REF2. As a result, the intensity of REF2 is substantially equal to that of REF1, the first reference beam produced by splitting with the beam splitter 1.

When a voltage is applied to the electro-optic material 4, it experiences a change in its refractive index and the state of polarization of the input beam IN launched into the material 4 will also change according to the magnitude of the voltage. The so affected light beam emerges as the output beam OUT from the electro-optic material 4 and is launched into the polarizing beam splitter 5. The output beam OUT is then split into two beams, one being the signal beam SG having an intensity of $\sin^2[(\pi/2)V/V_0]$ and the other being the second reference beam REF2 having an intensity of $\cos^2[(\pi/2)V/V_0]$. If, in this case, the signal beam SG is launched into the streak camera 7, with a sawtooth voltage being applied to the deflection electrodes 14 in the streak camera 7, a time-dependent change in the intensity of the output beam OUT can be observed on the phosphor screen 16 in the streak camera 7. In short, the intensity of light on the phosphor screen 16 is "zero" when no voltage is impressed on the electro-optic material 4, and light with certain intensity is emitted from that screen as a voltage is applied to the material 4.

In order to ensure that the voltage developing in a selected area of the object being measured is detected stably with the streak camera 7 at all times of its operation, an electric trigger signal TR must be produced in such a way that the timing of generation of a sawtooth voltage to be applied to the deflection electrodes 14 in the streak camera 7 will be synchronous with the signal beam SG.

In the embodiment being discussed, the second reference beam REF2 which is one of the two light beams obtained by splitting with the splitter 5, is used to synthesize the electric trigger signal TR. If the electro-optic material 4 is impressed with the voltage developing in a selected area of the object being measured, a change in light intensity to be detected occurs in the signal beam SG, the other of the two light beams obtained by splitting with the splitter 5, and at the same time, a change in intensity also occurs in the second reference beam REF2. If the change in the intensity of REF2 is converted into an electric signal by the photoelectric converter 8 and subsequently applied as an electric trigger signal TR' to the deflection electrodes 14, the change in the intensity of signal beam SG is expected to be reliably detected with the streak camera 7. In practice, however, the intensity of the light beam coming from the CW light source 53 often fluctuates because of the inherent characteristics of the latter. In such a case, the intensity of output beam OUT will change as a consequence of the fluctuation in the intensity of light beam from the CW light source 53 even if no voltage is applied to the electro-optic material 4, and the resulting outputting of an electric trigger signal TR' will lead to erroneous operation of the streak camera 7. In order to prevent the occurrence of this problem, the embodiment under discussion incorporates the following additional feature: the first reference beam REF1 obtained by splitting with the polarizing beam splitter 1 is delayed for a predetermined period by the delay means 6 before it is launched into the photoelectric converter 9 where it is converted into an electric signal; this electric signal is compared in the differential amplifier 10 with the one supplied from the photoelectric converter 8 and the difference is supplied as an electric trigger signal TR to the streak camera 7. The period for which the application of the first reference beam REF1 to the photoelectric converter 9 is delayed by the delay means 6 is equal to the time required for the input beam IN issuing from the beam splitter 1 to be launched into the electro-optic material 4, be reflected from its tip, travel back through the material 4, pass through the beam splitter 5, and finally be supplied to the photoelectric converter 8.

The following advantage results from the design feature described above: even if the intensity of the light beam issuing from the CW light source 53 fluctuates, the intensity of the second reference beam REF2 supplied to the photoelectric converter 8 will change in proportion to the intensity of the first reference beam REF1 supplied to the photoelectric converter 9, so in the differential amplifier 10 the electric signal component due to the fluctuation in the intensity of light beam BM from the CW light source 53 can be rejected from the electric signal supplied from the photoelectric converter 8, thereby preventing the amplifier 10 from outputting an electric trigger signal TR.

If the voltage developing in a selected area of the object being measured is applied to the electro-optic material 4, the intensity of the second reference beam REF2 supplied to the photoelectric converter 8 will change but the intensity of the first reference beam REF1 supplied to the photoelectric converter 9 will not change with the applied voltage, so the difference between the two intensities can be extracted in the differential amplifier 10 in such a way that the electric trigger signal TR is supplied to the streak camera 7 only when the voltage developing in a selected area of the object of interest is impressed on the electro-optic material 4. This is the mechanism by which the change in the intensity of the signal beam SG can always be detected in a stable way.

In order to ensure that the differential amplifier 10 is supplied with two electric signals of the same intensity when the voltage developing in the object of interest is not applied to the electro-optic material 4, a variable gain amplifier may be inserted between the photoelectric converter 9 and the differential amplifier 10, or both of between 9 and 10 and between the other photoelectric converter 8 and the amplifier 10. This is effective in producing an even better-timed electric trigger signal TR.

In order to make sure that the signal beam SG is detected in synchronism with the sweeping of the streak camera in response to an electric trigger signal TR, the signal beam SG must be passed through some guide means, for example, a predetermined length of an optical fiber.

In the embodiment described above, an inner surface of a light-splitting and extracting part of the optical probe 3 and an outer surface of the electro-optic material are preferably provided with a black coating that is capable of preventing the scattering of a light beam from that inner surface.

The foregoing embodiment also assumes that the tip of the electro-optic material is brought close to the object to be measured but not as close as to make contact with this object. If desired, the tip of the electro-optic material may be held in contact with the object of interest during the voltage detection.

What is claimed is:

1. A voltage detector for detecting a voltage developing in a selected area of an object to be measured, comprising:
   a light source for emitting a CW (Continuous-Wave) light beam;
   a voltage-sensing part including a reflection means for reflecting an input light beam, and an electro-optic material whose refractive index changes according to said voltage developing in said selected area of said object;
   splitting and extracting means for splitting said CW light beam into a first reference light beam with a first predetermined polarized component and said input light beam with a second predetermined polarized component, and splitting an output light beam emerging from said electro-optic material after reflecting from said reflection means into a second reference light beam with a third predetermined polarized component and a signal light beam with a fourth predetermined polarized component;
   trigger generation means for receiving said first and second reference light beams and outputting a trigger signal; and
   a quick-response detector triggered by said trigger signal, for receiving said signal light beam from said splitting and extracting means, and determining said voltage developing in said selected area of said object.

2. A voltage detector as claimed in claim 1, wherein said splitting and extracting means comprises:
   a first polarizing beam splitter for splitting said CW light beam into said first reference light beam and said input light beam; and
   a second polarizing beam splitter for splitting said output light beam into said second reference light beam and said signal light beam.

3. A voltage detector as claimed in claim 2, wherein said first predetermined polarized component and said second predetermined polarized component are perpendicular to each other, and said third predetermined polarized component and said fourth predetermined polarized component are perpendicular to each other.

4. A voltage detector as claimed in claim 3, wherein said second predetermined polarized component and said third predetermined polarized component are substantially in a same direction when said voltage is not applied to said electro-optic material.

5. A voltage detector as claimed in claim 1, wherein said quick-response detector is a streak camera.

6. A voltage detector as claimed in claim 5, wherein said trigger generation means comprises:
   a first photoelectric converter for converting said received first reference light beam into a first electric signal;
   a second photoelectric converter for converting said received second reference light beam into a second electric signal; and
   a differential amplifier for receiving said first and second electric signals and producing said trigger signal on the basis of a difference between said received first and second electric signals.

7. A voltage detector as claimed in claim 6, further comprising a delay means disposed between said splitting and extracting means and siid first photoelectric converter, for delaying said first reference light beam so that said first and second reference light beams enter said respective photoelectric converters substantially at the same timing.

8. A voltage detector as claimed in claim 1, further comprising lens means disposed between said voltage-sensing part and said splitting and extracting means, for making traveling paths of said input light beam and said output light beam different from each other.

* * * * *